United States Patent
McIntosh et al.

(10) Patent No.: US 7,054,450 B2
(45) Date of Patent: May 30, 2006

(54) METHOD AND SYSTEM FOR ENSURING AUDIO SAFETY

(75) Inventors: Jason D. McIntosh, Weston, FL (US); David B. Cranfill, Sparta, NJ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/814,887

(22) Filed: Mar. 31, 2004

(65) Prior Publication Data

US 2005/0226428 A1    Oct. 13, 2005

(51) Int. Cl.
*A61F 11/06*    (2006.01)

(52) U.S. Cl. .......................... 381/72; 381/59; 381/107; 379/388.03; 455/245.1

(58) Field of Classification Search .................. 381/72, 381/55, 56, 58, 59, 106, 107; 379/395, 388.03, 379/390.01, 390.03; 455/232.1, 245.1

See application file for complete search history.

(56) References Cited

U.S. PATENT DOCUMENTS

| | | | | | |
|---|---|---|---|---|---|
| 4,928,307 | A | * | 5/1990 | Lynn ............................ | 381/72 |
| 5,369,711 | A | * | 11/1994 | Williamson, III ........... | 381/104 |
| 5,515,432 | A | * | 5/1996 | Rasmusson ............ | 379/388.01 |
| 6,041,126 | A | * | 3/2000 | Terai et al. ................ | 381/71.6 |
| 6,639,987 | B1 | | 10/2003 | McIntosh | |

* cited by examiner

*Primary Examiner*—Ping Lee
(74) *Attorney, Agent, or Firm*—Larry G. Brown

(57) ABSTRACT

The invention concerns a method (200) and a system (100) for ensuring audio safety in an audio device (110). The system includes a processor (112), a sensor (116), an analog safety circuit (114) and a first feedback loop (117). The processor is programmed to output an acoustic output signal (310, 410), the sensor monitors the acoustic output signal and the analog safety circuit is coupled to an output of the processor. The first feedback loop feeds the monitored acoustic signal from the sensor to the analog safety circuit. The analog safety circuit adjusts from a first level (312, 412) to a second level (316, 414) the acoustic output signal when the acoustic output signal exceeds a predetermined safety threshold (314, 420) such that the audio device has an output capacity that is capable of driving a sound pressure level of the acoustic output signal above the predetermined safety threshold.

14 Claims, 4 Drawing Sheets

METHOD AND SYSTEM FOR ENSURING AUDIO SAFETY

BACKGROUND OF THE INVENTION

1. Field of the Invention

This invention relates in general to communications devices and more particularly to methods for ensuring audio safety of such devices.

2. Description of the Related Art

Telecommunications devices are ubiquitous in today's society. Many of these devices, such as cellular telephones or two-way radios, include one or more speakers for broadcasting audio. To protect consumers, several safety guidelines have been established with respect to such devices. In particular, the audio that emanates from telecommunications devices is limited to levels that will prevent consumers from damaging their hearing.

Audio outputs for some telecommunications devices are controlled by a digital signal processor ("DSP"). For example, a telecommunications device may contain an actively-equalized earpiece (AEE) circuit, which, as is known in the art, may equalize the frequency response of an audio output signal in response to movement of the telecommunications device towards and away from a user's ear. The DSP in an AEE circuit can be programmed to limit the level of an audio output if that level reaches a certain threshold.

Unfortunately, the software with which the DSP is programmed typically contains bugs that limit the DSP's effectiveness. That is, the DSP may not properly prevent the audio output signal from exceeding a safety threshold. In response, the telecommunications device is typically designed such that the maximum output capacity of the device is kept to a level well below the safety threshold, which limits the audio performance of the device.

SUMMARY OF THE INVENTION

The present invention concerns a method for ensuring audio safety in an audio device. The method includes the steps of outputting an acoustic output signal with a processor, monitoring the acoustic output signal, feeding the monitored acoustic output signal to an analog safety circuit and adjusting from a first level to a second level the acoustic output signal with the analog safety circuit when the first level of the acoustic output signal reaches a predetermined safety threshold. The monitoring, feeding and adjusting steps enable the audio device to have an output capacity that is capable of driving the acoustic output signal to a sound pressure level above the predetermined safety threshold.

The method can further include the step of signaling the processor from the analog safety circuit when the acoustic output signal moves from the first level to the second level. In addition, the step of adjusting the acoustic output signal with the analog safety circuit can further include attenuating the acoustic output signal with the analog safety circuit such that the second level is lower than the first level.

In one arrangement, the method can also include the step of returning the acoustic output signal to a safety level that is below the predetermined safety threshold but higher than the second level once the acoustic output signal is adjusted to the second level. In addition, the method can include the step of holding the acoustic output signal at least substantially at the second level for a predetermined amount of time once the acoustic output signal is adjusted to the second level.

In yet another arrangement, when the acoustic output signal is adjusted to the second level, the method can further include the steps of further adjusting with the processor the acoustic output signal to cause the acoustic output signal to move to a third level, adjusting with the analog safety circuit the acoustic output signal to cause the acoustic output signal to move to at least one of the second level and an intermediate level and ramping with the processor the acoustic output signal to cause the acoustic output signal to move to a safety level that is above the second level and the intermediate level but below the predetermined safety threshold. Also, the step of monitoring the acoustic output signal can include monitoring the acoustic output signal with a microphone positioned adjacent to a speaker of the audio device.

The present invention also concerns a system for ensuring safety in an audio device. The system includes a processor in which the processor is programmed to output an acoustic output signal, a sensor in which the sensor monitors the acoustic output signal, an analog safety circuit coupled to an output of the processor and a first feedback loop. The first feedback loop feeds the monitored acoustic signal from the sensor to the analog safety circuit. Further, the analog safety circuit adjusts from a first level to a second level the acoustic output signal when the acoustic output signal exceeds a predetermined safety threshold such that the audio device has an output capacity that is capable of driving a sound pressure level of the acoustic output signal above the predetermined safety threshold. The system also includes suitable software and circuitry to carry out the processes described above.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION

Figure 1:
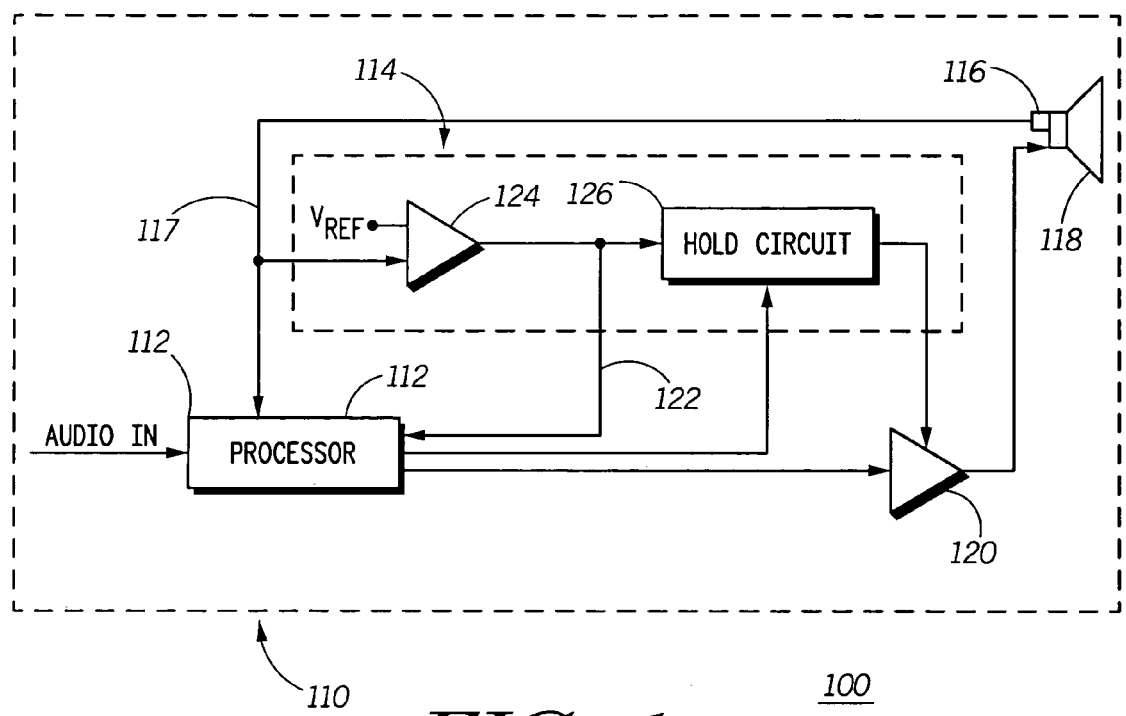
FIG. 1 illustrates a system for ensuring audio safety in an audio device in accordance with an embodiment of the inventive arrangements.

While the specification concludes with claims defining the features of the invention that are regarded as novel, it is believed that the invention will be better understood from a consideration of the following description in conjunction with the drawing figures, in which like reference numerals are carried forward.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Referring to FIG. 1, a system 100 for ensuring audio safety in an audio device is shown. In one arrangement, the system 100 can include an audio device 110, which can have a processor 112, such as a digital signal processor, an analog safety circuit 114, a sensor 116, a speaker 118 and an amplifier 120 that can drive the speaker 118. For purposes of the invention, the term audio device can include any device that is capable of broadcasting sound. Moreover, the term analog safety circuit can mean any analog component or group of analog components that can be used to help control the output of an audio signal to ensure that a user is protected from unacceptable levels of audio.

The processor 112 can receive an audio signal input and an input from the sensor 116 through a first feedback loop 117 and can output signals to the amplifier 120. In addition, the analog safety circuit 114 can receive an input from the sensor 116 through the first feedback loop 117 and can control the operation of the amplifier 120. In one particular embodiment, the audio device 110 can include a second feedback loop 122 that can couple the analog safety circuit 114 to the processor 112. As those of ordinary skill in the art will appreciate, the processor 112 can include analog-to-digital (A/D) and digital-to-analog (D/A) converters where appropriate.

In one arrangement, the analog safety circuit 114 can include a comparator 124 and a hold circuit 126 in which the output of the comparator 124 is coupled to the hold circuit 126. Moreover, the output of the hold circuit 126 can be coupled to the amplifier 120, and the processor 112 can control the operation of the hold circuit 126. As an example, the second feedback loop 122 can be coupled to the output of the comparator 124. As will be further explained below, the reference voltage of the comparator 124 can correspond to a predetermined safety threshold.

Figure 2:
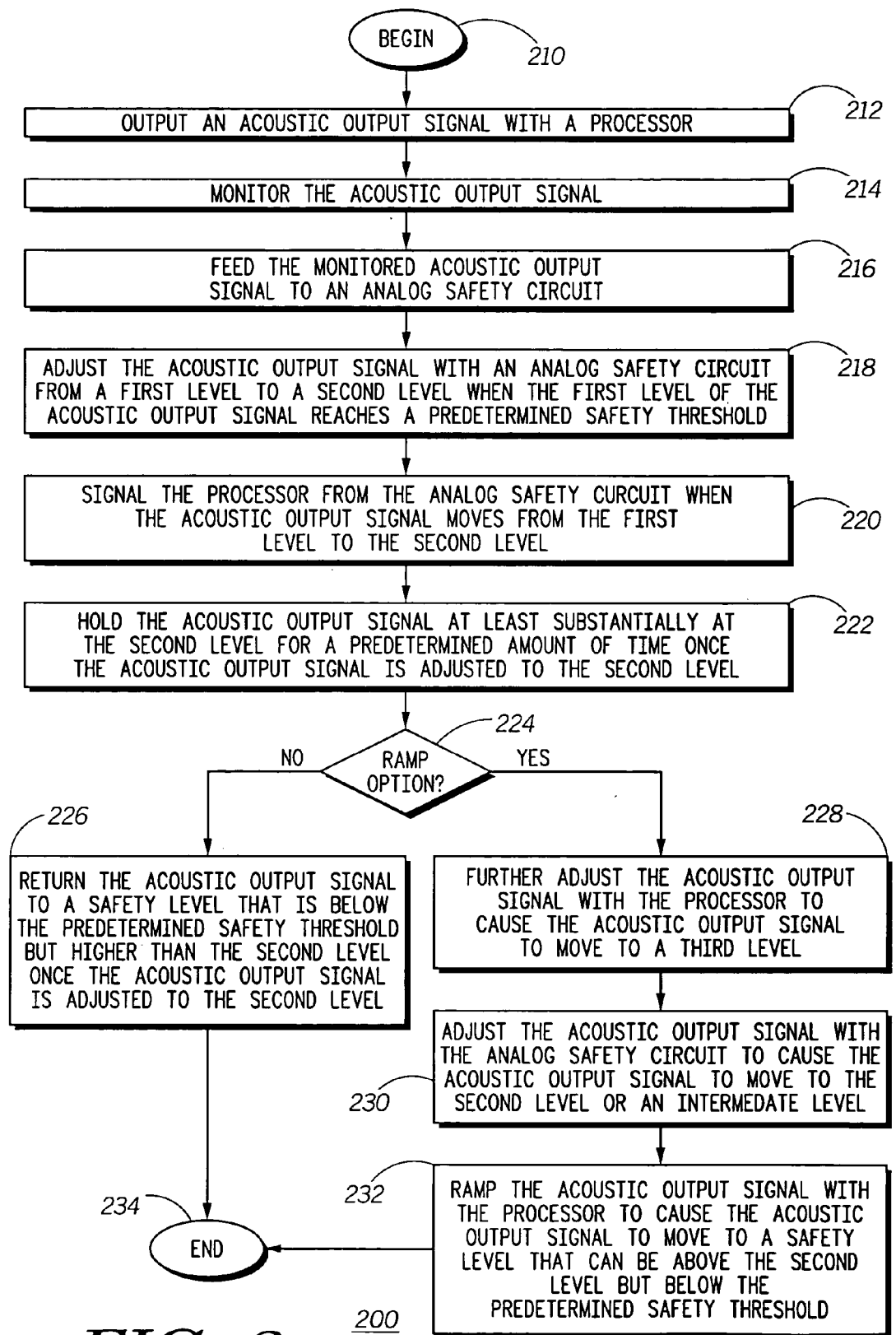
FIG. 2 illustrates a method of ensuring audio safety in an audio device in accordance with an embodiment of the inventive arrangements.

In accordance with an embodiment of the inventive arrangements, the processor 112 can control an audio output that is to be broadcast from the speaker 118. If the sound pressure level of this audio broadcast reaches a predetermined safety threshold, the analog safety circuit 114 can control the operation of the amplifier 120 to lower the sound pressure level of the audio. The processor 112 can then make adjustments to prevent driving the audio output higher during this attenuated state. Additionally, the analog safety circuit 114, and in certain instances in combination with the processor 112, can return the audio output to a higher sound pressure level, one that does not, however, exceed the predetermined safety threshold. Referring to FIG. 2, a method 200 is shown for describing in detail how this process can be performed. When explaining the method 200, reference will be made to the components of FIG. 1, although it is understood that the method 200 can be practiced with any other suitable system.

At step 210, the method 200 can begin. At step 212, an acoustic output signal can be outputted with a processor, and the acoustic output signal can be monitored, as shown at step 214. In addition, at step 216, the monitored acoustic output signal can be fed to an analog safety circuit. For example, referring to FIG. 1, the processor 112 can output an acoustic output signal, which can be fed to the amplifier 120 and emanated from the speaker 118. The amplifier 120 can amplify the acoustic output level to an appropriate amplitude level, and the acoustic output signal that is broadcast can produce a sound pressure level.

The sensor 116 can monitor the sound pressure level of the acoustic output signal that is broadcast from the speaker 118. In one arrangement, the sensor 116 can be a microphone, and the sensor 116 can be positioned adjacent to the speaker 118 of the audio device 110. Those of ordinary skill in the art, however, will appreciate that the sensor 116 can be positioned at other suitable locations in the audio device 110. Additionally, the monitored acoustic output signal can be fed from the sensor 116 to the analog safety circuit 114. Specifically, the monitored acoustic output signal can be fed through the first feedback loop 117 to the comparator 124 of the analog safety circuit 114. The monitored signal can also be fed through the feedback loop 117 to the processor 112.

Referring back to the method 200 of FIG. 2, the acoustic output signal can be adjusted with the analog safety circuit from a first level to a second level when the first level of the acoustic output signal reaches a predetermined safety threshold. For example, referring back to FIG. 1, the acoustic output signal that is output by the amplifier 120 (from the processor 112) can have a first level at the output of the speaker 118. As an example, the first level can be a sound pressure level that can be measured in decibels (dB), although the first level can be any other suitable measurable parameter.

In another arrangement, the reference voltage of the comparator 124 can correspond to a predetermined safety threshold. Specifically, the predetermined safety threshold can be a sound pressure level that can be set to a dB value for purposes of ensuring that a user's hearing will not be damaged. Of course, the predetermined safety threshold can also be any other suitable measurable parameter. If the first level of the acoustic output signal reaches the predetermined safety threshold, then the signal amplitude of the input from the sensor 116 that is received at the comparator 124 can rise above the reference voltage. In that case, the output of the comparator 124 can be set high. This high output of the comparator 124 (through the hold circuit 126) can control an adjustment state in the amplifier 120, which can cause the acoustic output signal to move from the first level to a second level. The second level can also be another sound pressure level measured in dB, which, as an example, can be below the predetermined safety threshold. The second level can also be any other suitable measurable parameter.

As an example, the high output of the comparator 124 and the subsequent control of the amplifier 120 can cause the acoustic output signal to be attenuated from a first signal amplitude to a second signal amplitude. As a result, the second level of the acoustic output signal can be lower than the first level, which can cause the sound pressure level of the acoustic output signal to drop below the predetermined safety threshold.

Figure 3:
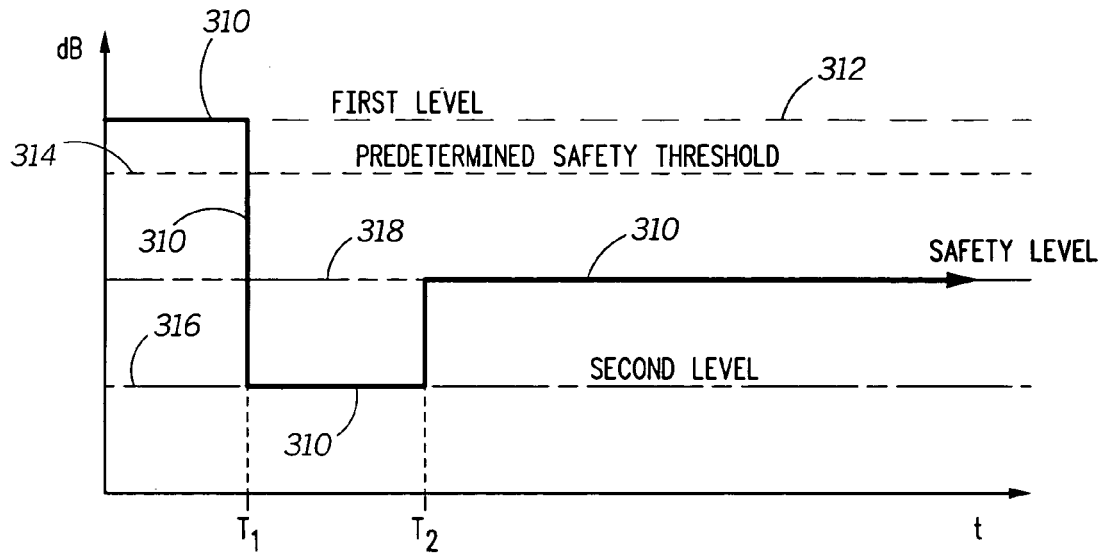
FIG. 3 illustrates a graph of an acoustic output signal in accordance with an embodiment of the inventive arrangements.

Referring to FIG. 3, an example of a graphical depiction of this process is illustrated. Here, a graph 300 represents an acoustic output signal, which can be referred to as acoustic output signal 310. As noted earlier, the acoustic output signal 310 can be measured in dBs, which is done so here. It is understood that the graph 300, including the duration and magnitude of the illustrated events, is merely a representation meant to explain how the invention operates and is not necessarily an exact reproduction of the inventive process. As shown in graph 300, the acoustic output signal 310 can be at a first level 312, and the first level 312 can be above a predetermined safety threshold 314. In response to the adjusting step (see step 218 of the method 200 of FIG. 2), the acoustic output signal can be decreased to a second level 316, which can be below the predetermined safety threshold 314 (see time=$T_1$).

Referring back to the method 200 of FIG. 2, at step 220, the processor can be signaled from the analog safety circuit when the acoustic output signal moves from the first level to the second level. Further, at step 222, the acoustic output signal can be held at least substantially at the second level for a predetermined amount of time once the acoustic output signal is adjusted to the second level. For purposes of the invention, the term "substantially at the second level" can mean the exact second level or slight or even moderate deviations therefrom. As an example, referring once again to FIG. 1, when the acoustic output signal is moved from the first level to the second level, the processor 112 can be signaled through the second feedback loop 122. As will be explained later, the processor 112 can perform adjustments to ensure that the acoustic output signal will remain below the predetermined safety threshold.

The hold circuit 126 can ensure that the acoustic output signal remains at least substantially at the second level for a predetermined amount of time. That is, once the output of the comparator 124 goes high, the hold circuit 126 can maintain for a predetermined amount of time an attenuation state of the amplifier 120. The processor 112 can set the predetermined amount of time, and as will be explained below, can signal the hold circuit 126 to release the attenuation state of the amplifier 120 once the predetermined amount of time expires. This process can ensure that the condition that caused the first level of the acoustic output signal to exceed the predetermined safety threshold has passed before the output of the amplifier 120 is increased.

Referring once again to the method 200 of FIG. 2, at decision block 224, it can be determined whether a ramp option will be selected. If it is not, then at step 226, the acoustic output signal can be returned to a safety level that is below the predetermined safety threshold but higher than the second level once the acoustic output signal is adjusted to the second level. For example, moving to FIG. 1, once the predetermined amount of time for holding the amplifier 120 to an attenuated state expires, the processor 112 can signal the hold circuit 126 to release the amplifier 120 from the attenuated state. During the process of modifying the acoustic output signal from the first level to the second level, the processor 112 can also adjust its internal algorithms to account for the change in the acoustic output signal. For example, the processor 112 can lower its sound pressure level targets to prevent the acoustic output signal being driven higher in an effort to reach these targets when the acoustic output signal is attenuated, as described above.

At this point, the amplifier 120 can return to its previous output level, and the sound pressure level of the acoustic output signal can correspondingly increase. Referring to FIG. 3, an example of this process is illustrated. When the amplifier 120 is returned to its previous state, the acoustic output signal 310 can move to a safety level 318 (see time=$T_2$), which can be a sound pressure level that can be below the predetermined safety threshold 314 and above the second level 316. The safety level 316 can also be any other suitable measurable parameter.

Referring back to the method 200 of FIG. 2, at decision block 224, if the ramp option is selected, then the acoustic output signal can be further adjusted with the processor to cause the acoustic output signal to move to a third level, as shown at step 228. At step 230, the acoustic output signal can be adjusted with the analog safety circuit to cause the acoustic output signal to move to the second level or an intermediate level. The acoustic output signal can then be ramped with the processor to cause the acoustic output signal to move to a safety level that can be above the second level but below the predetermined safety threshold, as shown at step 232.

Figure 4:
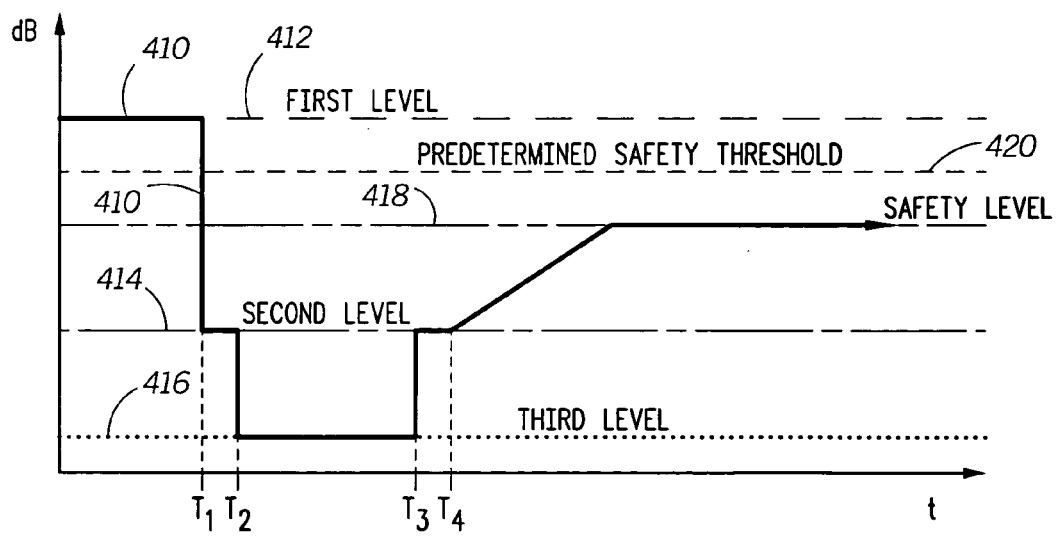
FIG. 4 illustrates another graph of an acoustic output signal in accordance with an embodiment of the inventive arrangements.

To describe the process above, reference will be made to FIG. 1 and FIG. 4, which illustrates a graph 400 of an acoustic output signal 410 (FIG. 4 also shows the adjustment of the acoustic output signal 410 from a first level 412 to a second level 414 (see time=$T_1$), which was explained in relation to FIG. 3). When the acoustic output signal 410 is reduced to the second level 414, the processor 112 can further adjust the acoustic output signal to cause the acoustic output signal to move to a third level 416. The third level 416 can be a sound pressure level that can be lower than the second level 414, and those of ordinary skill in the art will appreciate that there are several ways for the processor 112 to perform this step. The third level 416 can also be any other suitable measurable parameter.

As explained earlier, once the predetermined amount of time that the hold circuit 126 is to keep the amplifier 120 in an attenuated state expires, the hold circuit 126, i.e., the analog safety circuit 114, can allow the output of the amplifier 120 to increase. This increase can enable the acoustic output signal 410 to return to the second level 414 or an intermediate level (not shown) that can be either above or below the second level 414 (see time=$T_3$). The processor 112 can then manipulate the acoustic output signal 410 to cause the acoustic output signal to ramp up or gradually increase to a safety level 418 that is above the second level 414 but below a predetermined safety threshold 420 (see time=$T_4$). The processor 112 can gradually increase the acoustic output signal in accordance with any suitable manner, as those of ordinary skill in the art will appreciate.

Moving the acoustic output signal to a safety level in accordance with steps 228–232 (see FIG. 2) allows the acoustic output signal to be gradually returned to a safe audio level. This process can avoid a sudden increase in the audio that a user may hear (from the analog safety circuit 114 removing the attenuated condition from the amplifier 120), which can improve the user's experience.

Referring back to FIG. 2, following steps 226 or 232, the method 200 can end at step 234. If the sound pressure level of the acoustic output signal reaches the predetermined safety threshold again, however, the process of adjusting the acoustic output signal in accordance with the steps of method 200 can be repeated.

Thus, the invention can be used to improve the operation of an audio device that relies on a processor, such as a digital signal processor, to output an acoustic signal. Because such processors are sometimes susceptible to malfunction, the analog safety circuit employed by the invention can be used to prevent a user from being exposed to unsafe levels of audio. As a result, the steps of the method 200 of FIG. 2, in particular the outputting, monitoring and feeding steps (steps 212–216) can enable an audio device in which these steps are practiced to have an output capacity that is capable of driving an acoustic output signal to a sound pressure level (or some other measurable criteria) above a predetermined safety threshold.

Figure 5:
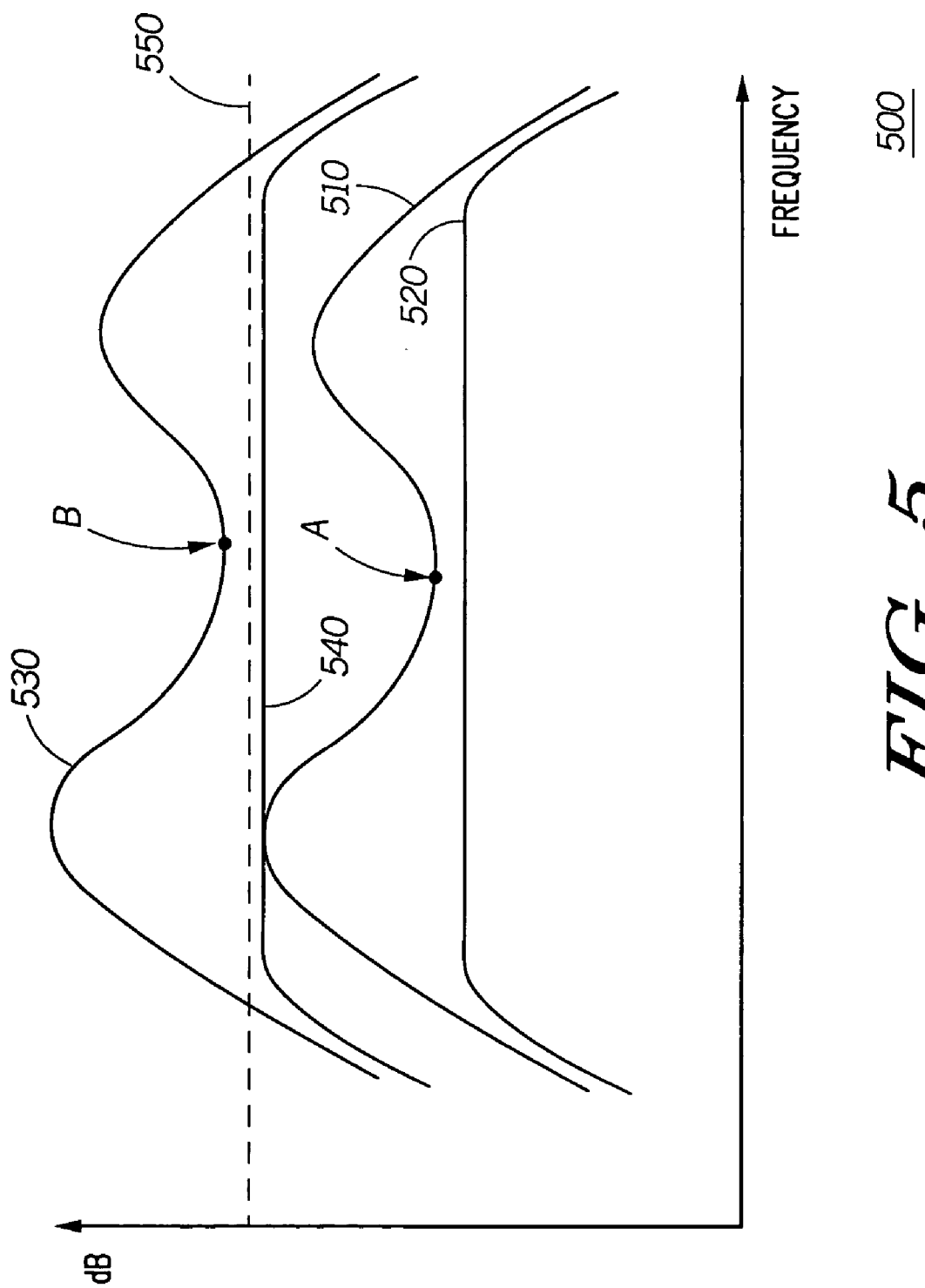
FIG. 5 illustrates a set of frequency response curves in accordance with an embodiment of the inventive arrangements.

One example of where the invention can be employed is in an actively-equalized earpiece (AEE) circuit, which, as is known in the art, may equalize the frequency response of an audio output signal in response to movement of the telecommunications device towards and away from a user's ear. Referring to FIG. 5, a graph 500 (dB verses frequency) that shows several frequency response curves is illustrated. The graph 500 can have a first frequency response curve 510 and a corresponding first AEE frequency response curve 520. The graph 500 can also include a second frequency response curve 530 and a corresponding second AEE frequency response 540. The graph also shows a predetermined safety threshold 550. The first set of curves 510, 520 can be associated with an audio device having an AEE circuit but no analog safety circuit. The second set of curves 530, 540 can be associated with an audio device having an AEE circuit and an analog safety circuit.

The first frequency response curve 510 shows the range of frequencies for an audio device, and the corresponding first AEE frequency response curve 520 depicts the first frequency response curve 510 after it has been equalized by an AEE circuit (a similar relationship exists between the curves 530 and 540). Typically, an AEE circuit may equalize a frequency response to a substantially flat condition, such as a sound pressure level that is roughly equal to the minimum output of an audio device across the entire audio frequency range. For example, in this case, the corresponding first AEE frequency response curve 520 should not exceed the lowest point of the first frequency response curve 510, which is referenced as point A. As noted earlier, the audio device in this example does not have an analog safety circuit. As a result, the output capacity of the audio device cannot exceed the predetermined safety threshold at any frequency, which in turn means that the corresponding first AEE frequency response curve is well below the safety threshold 550.

In the case of the second curves 530 and 540, however, because it has an analog safety circuit, the audio device can be designed to have an output capacity that exceeds the predetermined safety threshold 550, at least for a portion of the frequencies of the audio device. An example of this principle is shown with respect to the second frequency response curve 530. As such, the corresponding second AEE frequency response curve 540 can be at a level that is much closer to the predetermined safety threshold 550. That is, the corresponding second AEE frequency response curve 540 can be driven to the lowest point of the second frequency response curve 530, which is labeled as point B. An audio device that operates in this manner is superior because it can drive the output to a maximum sound pressure level across the entire audio frequency band of the audio device.

It is understood, however, that the description associate with FIG. 5 is merely one example of how the invention can be implemented, i.e., the invention is not limited to audio devices having AEE circuits. Moreover, the curves depicted in FIG. 5 are provided merely to explain how the invention may be useful and are not intended to reflect the exact nature of the frequency response for any particular audio device.

It is understood that FIGS. 1–5 merely represent examples of how the invention can be implemented and executed. The invention is not limited to these particular examples. For example, those of ordinary skill in the art will appreciate that it is unnecessary to implement a hold circuit in the system or to feed the output of an analog safety circuit to a processor in the system. In addition, while the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for ensuring audio safety in an audio device, comprising the steps of:
  outputting an acoustic output signal with a processor;
  monitoring the acoustic output signal;
  feeding the monitored acoustic output signal to an analog safety circuit;
  adjusting from a first level to a second level the acoustic output signal with the analog safety circuit when the first level of the acoustic output signal reaches a predetermined safety threshold, wherein the monitoring, feeding and adjusting steps enable the audio device to have an output capacity that is capable of driving the acoustic output signal to a sound pressure level above the predetermined safety threshold, wherein the analog safety circuit serves as a supplement to the ability of the processor to prevent the acoustic output signal from reaching the predetermined safety threshold; and
  signaling the processor from the analog safety circuit when the acoustic output signal moves from the first level to the second level, wherein the processor performs adjustments to account for the first level of the acoustic output signal reaching the predetermined safety threshold.

2. The method according to claim 1, wherein the adjusting the acoustic output signal with the analog safety circuit step comprises attenuating the acoustic output signal with the analog safety circuit such that the second level is lower than the first level.

3. The method according to claim 1, further comprising the step of returning the acoustic output signal to a safety level that is below the predetermined safety threshold but higher than the second level once the acoustic output signal is adjusted to the second level.

4. The method according to claim 3, further comprising the step of holding the acoustic output signal at least substantially at the second level for a predetermined amount of time once the acoustic output signal is adjusted to the second level.

5. The method according to claim 1, further comprising the steps of:
  when the acoustic output signal is adjusted to the second level, further adjusting with the processor the acoustic output signal to cause the acoustic output signal to move to a third level;
  adjusting with the analog safety circuit the acoustic output signal to cause the acoustic output signal to move to at least one of the second level and an intermediate level; and
  ramping with the processor the acoustic output signal to cause the acoustic output signal to move to a safety level that is above the second level and the intermediate level but below the predetermined safety threshold.

6. The method according to claim 1, wherein the monitoring the acoustic output signal step comprises monitoring the acoustic output signal with a microphone positioned adjacent to a speaker of the audio device.

7. The method according to otaim 1, wherein the audio device includes an actively-equalized earpiece circuit.

8. A system for ensuring safety in an audio device, comprising:
- a processor, wherein the processor is programmed to output an acoustic output signal;
- a sensor, wherein the sensor monitors the acoustic output signal;
- an analog safety circuit coupled to an output of the processor;
- a first feedback loop, wherein the first feedback loop feeds the monitored acoustic signal from the sensor to the analog safety circuit;
- wherein the analog safety circuit adjusts from a first level to a second level the acoustic output signal when the acoustic output signal reaches a predetermined safety threshold such that the audio device has an output capacity that is capable of driving a sound pressure level of the acoustic output signal above the predetermined safety threshold, wherein the analog safety circuit serves as a supplement to the ability of the processor to prevent the acoustic output signal from reaching the predetermined safety threshold; and
- a second feedback loop, wherein the analog safety circuit signals the processor through the second feedback loop when the analog safety circuit adjusts the acoustic output signal from the first level to the second level, wherein the processor is further programmed to perform adjustments to account for the first level of the acoustic output signal reaching the predetermined safety threshold.

9. The system according to claim 8, wherein the analog safety circuit causes the acoustic output signal to be attenuated such that the second level is lower than the first level.

10. The system according to claim 8, wherein the processor and the analog safety circuit return the acoustic output signal to a safety level that is below the predetermined safety threshold but higher than the second level once the acoustic output signal is adjusted to the second level.

11. The system according to claim 10, further comprising a holding circuit, wherein the holding circuit ensures that the acoustic output signal is held at least substantially at the second level for a predetermined amount of time once the acoustic output signal is adjusted to the second level.

12. The system according to claim 8, wherein when the acoustic output signal is adjusted to the second level, the processor is further programmed to further adjust the acoustic output signal to cause the acoustic output signal to move to a third level, wherein the analog safety circuit adjusts the acoustic output signal to cause the acoustic output signal to move to at least one of the second level and an intermediate level and wherein the processor is further programmed to ramp the acoustic output signal to cause the acoustic output signal to move to a safety level that is above the second level and the intermediate level but below the predetermined threshold.

13. The system according to claim 8, wherein the sensor is a microphone positioned adjacent to a speaker of the audio device.

14. The system according to claim 8, wherein the audio device includes an actively-equalized earpiece circuit.

* * * * *